United States Patent
Funakura et al.

(10) Patent No.: US 6,836,012 B2
(45) Date of Patent: Dec. 28, 2004

(54) SEMICONDUCTOR PACKAGE AND METHOD OF MANUFACTURING THE SAME

(75) Inventors: Hiroshi Funakura, Kanagawa-ken (JP); Eiichi Hosomi, Kanagawa-ken (JP); Yasuhiro Koshio, Kanagawa-ken (JP); Tetsuya Nagaoka, Kanagawa-ken (JP); Junya Nagano, Kanagawa-ken (JP); Mitsuru Oida, Kanagawa-ken (JP); Masatoshi Fukuda, Kanagawa-ken (JP); Atsushi Kurosu, Tokyo (JP); Kaoru Kawai, Kanagawa-ken (JP); Osamu Yamagata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/108,363

(22) Filed: Mar. 29, 2002

(65) Prior Publication Data

US 2002/0140095 A1 Oct. 3, 2002

(30) Foreign Application Priority Data

Mar. 30, 2001 (JP) .................................... P2001-101840

(51) Int. Cl.⁷ ............................................. H01L 23/14
(52) U.S. Cl. ....................... 257/702; 257/787; 257/788; 257/779
(58) Field of Search ........................ 257/702, 787–789, 257/779–780, 668, 737–738

(56) References Cited

U.S. PATENT DOCUMENTS

| 5,874,784 A | * | 2/1999 | Aoki et al. .................. 257/787 |
| 5,990,546 A | | 11/1999 | Igarashi et al. ............. 257/700 |
| 6,166,433 A | * | 12/2000 | Takashima et al. ......... 257/702 |
| 6,340,793 B1 | * | 1/2002 | Yaguchi et al. ............ 174/52.4 |

FOREIGN PATENT DOCUMENTS

| JP | 08-078574 | 3/1996 |
| JP | 2000-164761 | 6/2000 |
| JP | 2001-127095 | 5/2001 |

OTHER PUBLICATIONS

U.S. Appl. No. 09/854,559, filed May 15, 2001, to Funakura et al.

* cited by examiner

*Primary Examiner*—Luan Thai
(74) *Attorney, Agent, or Firm*—Finnegan, Henderson, Farabow, Garrett & Dunner, L.L.P.

(57) ABSTRACT

A semiconductor package has (a) a package base, (b) package terminals formed on the package base and used to connect the semiconductor package to another device, (c) a wiring layer formed on the package base and electrically connected to the package terminals, (d) a semiconductor chip mounted on the package base and electrically connected to the wiring layer, (e) a low-elasticity resin layer formed between a resin mold and the wiring layer and between the package base and the resin mold, and (f) the resin mold sealing the package base, the wiring layer, the semiconductor chip, and the low-elasticity resin layer.

7 Claims, 15 Drawing Sheets

(PRIOR ART)

(PRIOR ART)

(PRIOR ART)

SEMICONDUCTOR PACKAGE AND METHOD OF MANUFACTURING THE SAME

CROSS REFERENCE TO RELATED APPLICATIONS

This application is based upon and claims the benefit of priority from the prior Japanese Patent Application No. 2001-101840 filed on Mar. 30, 2001, the entire contents of which are incorporated herein by reference.

BACKGROUND OF THE INVENTION

1. Field of the Invention

The present invention relates to a semiconductor package and a method of manufacturing the semiconductor package. In particular, the present invention relates to a technique of improving the reliability of outer lead bonding (OLB) parts of a semiconductor device.

2. Description of the Related Art

As shown in FIGS. 1A and 1B, the wiring layer 30 is formed on a package base 20 and is connected to the semiconductor chip 10 through the contacts 13. These contacts 13 are inner lead bonding (ILB) parts that are sealed with the underfill resin layer 40. The underfill resin layer 40 is extended to the edge of the package. In FIG. 1B, the package is mounted on the board 80 with solder 75.

In FIG. 2A, a package base 20 is provided with ILB parts 13, a wiring layer 30, and package terminals 70 and is covered with an underfill resin layer 40. In FIG. 2B, a semiconductor chip 10 is placed, and electrode terminals of the chip 10 are connected to the wiring layer 30 through the ILB parts 13. In FIG. 2C, the semiconductor chip 10 and underfill resin layer 40 are sealed with a resin mold 60.

As shown in FIGS. 3A and 3B, the package of FIG. 3A differs from the package of FIG. 1A in that it employs no underfill resin and seals contacts (ILB parts 13) between a semiconductor chip 10 and a wiring layer 30 with a resin mold 60.

In FIG. 4A, a package base 20 is provided with ILB parts 13, a wiring layer 30, and package terminals 70. In FIG. 4B, a semiconductor chip 10 is set without underfill resin and electrode terminals of the chip 10 are connected to the wiring layer 30 through the ILB parts 13. In FIG. 4C, the semiconductor chip 10, package base 20, wiring layer 30, and ILB parts 13 are sealed with a resin mold 60.

The underfill resin layer 40 of FIG. 1A must have the following properties:

(1) a high fluidity to collectively seal the ILB parts 13;
(2) a low thermal expansion coefficient $\alpha$ to improve the reliability of the ILB parts 13; and
(3) a low elasticity modulus E, i.e., softness to improve the reliability of OLB parts, the OLB parts corresponding to contacts between the wiring layer 30 and the package terminals 70.

Generally, a resin having a low thermal expansion coefficient $\alpha$ has a high elasticity modulus E, and a resin having a high thermal expansion coefficient $\alpha$ has a low elasticity modulus E. There are resins such as a no conductive film (NCF) having a low thermal expansion coefficient $\alpha$ and a low elasticity modulus E. This type of resin, however, is expensive.

A semiconductor package employing an underfill resin layer involves the following problems:

(1) low reliability of OLB parts if the underfill resin layer has a low thermal expansion coefficient $\alpha$ and a high elasticity modulus E to secure the reliability of ILB parts;

(2) low reliability of the ILB parts if the underfill resin layer has a high thermal expansion coefficient $\alpha$ and a low elasticity modulus E to secure the reliability of the OLB parts; and (3) increase cost of the package if the underfill resin layer is made from, for example, an NCF to secure the reliability of both the ILB and OLB parts.

The semiconductor package of FIG. 3A is advantageous in that it:

(1) employs no underfill resin layer, reducing process and material costs; and
(2) employs the resin mold 60, which generally has a low thermal expansion coefficient $\alpha$, thus improving the reliability of the ILB parts 13.

The package of FIG. 3A, however, is disadvantageous in that:

(3) the reliability of the OLB parts is reduced, due to the hardness of the resin mold 60 having a high elasticity modulus E. Namely, the high elasticity modulus of the resin mold 60 on the package terminals 70 causes a concentration of strain at the OLB parts. If the package having no underfill resin layer is large, the reliability of the OLB parts falls critically. In this case, the underfill resin layer must be prepared to improve the reliability of the OLB parts.

When semiconductor packages are diced into individual packages, inferior adhesion between a resin mold and a wiring layer in a package causes a further problem of separating the resin mold from the wiring layer at the edge of the package.

Namely, the semiconductor package having no underfill resin layer involves the following problems:

(1) low reliability of OLB parts; and
(2) peeling on the side faces of the package.

SUMMARY OF THE INVENTION

According to an embodiment of the present invention, a semiconductor package includes (a) a package base, (b) package terminals formed on the package base and used to connect the semiconductor package to another device, (c) a wiring layer formed on the package base and electrically connected to the package terminals, (d) a semiconductor chip mounted on the package base and electrically connected to the wiring layer, (e) a low-elasticity resin layer formed between a resin mold and the wiring layer and between the package base and the resin mold, and (f) the resin mold sealing the package base, the wiring layer, the semiconductor chip, and the low-elasticity resin layer. The low-elasticity resin layer has a lower elasticity modulus than the resin mold.

According to another embodiment of the present invention, a semiconductor package manufacturing method includes (a) forming a wiring layer on a package base, (b) electrically connecting a semiconductor chip to the wiring layer, (c) forming a low-elasticity resin layer having a lower elasticity modulus than a resin mold, onto the package base and the wiring layer, and (d) forming the resin mold on the package base, the wiring layer, the semiconductor chip, and the low-elasticity resin layer.

DETAILED DESCRIPTION OF EMBODIMENTS

Figure 1A:
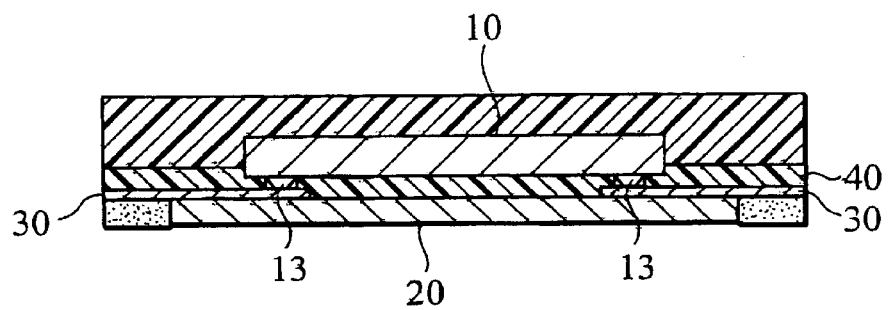
FIG. 1A is a sectional view showing a semiconductor package having an underfill resin layer to seal contacts between a semiconductor chip and a wiring layer, according to a related art.
Figure 1B:
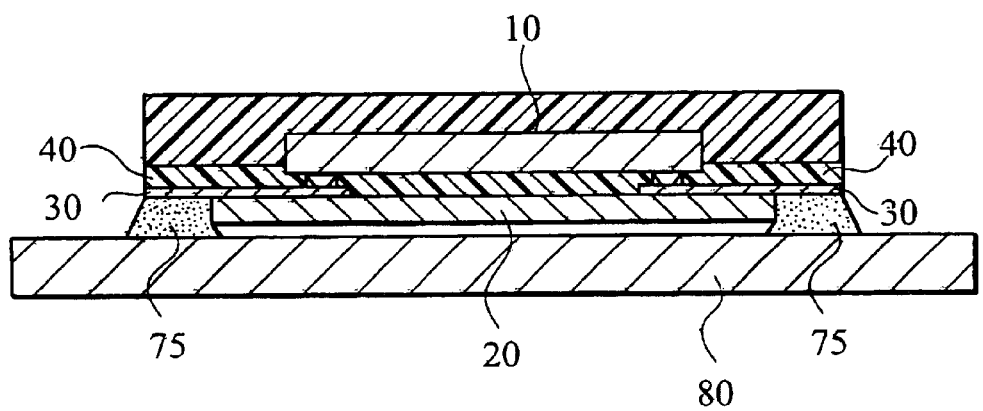
FIG. 1B is a sectional view showing the package of FIG. 1A mounted on a board.
Figure 2A:
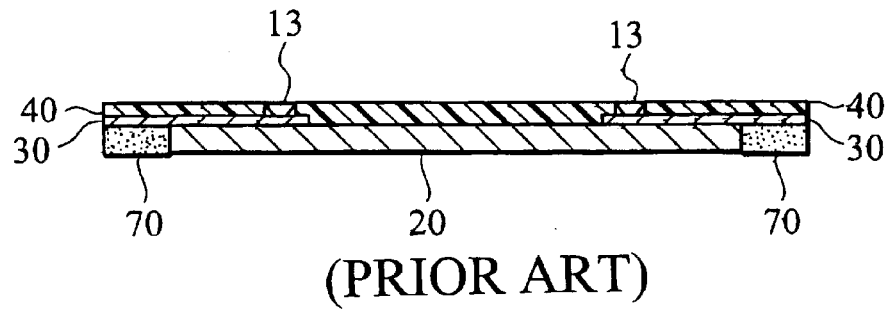
FIGS. 2A to 2C are sectional views showing a method of manufacturing the package of FIG. 1A.
Figure 2B:
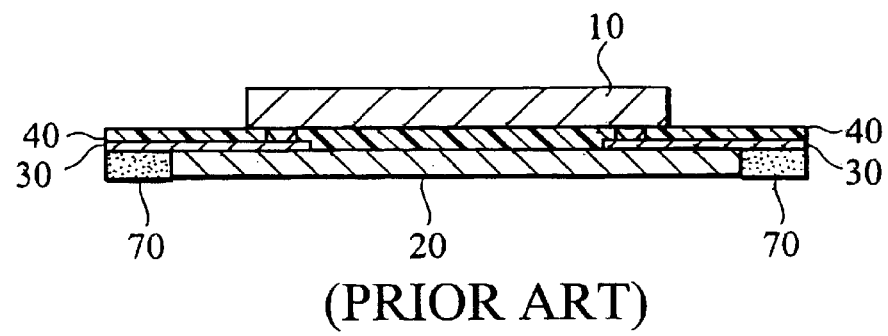
Figure 2C:
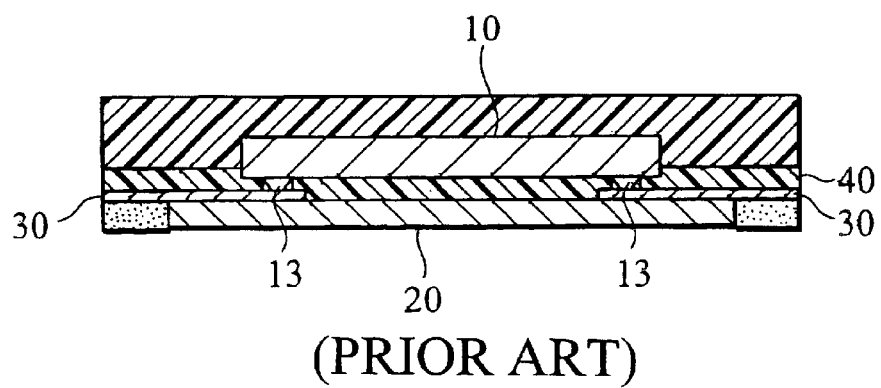
Figure 3A:
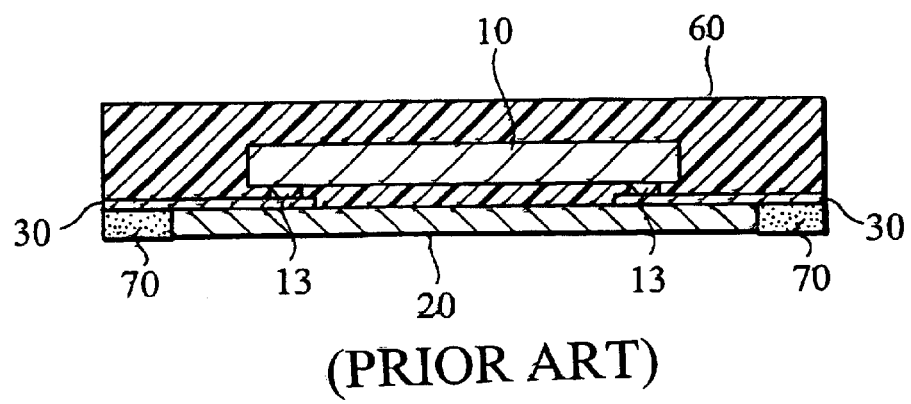
FIG. 3A is a sectional view showing a semiconductor package without an underfill resin layer, having a resin mold to seal contacts between a semiconductor chip and a wiring layer, according to another related art.
Figure 3B:
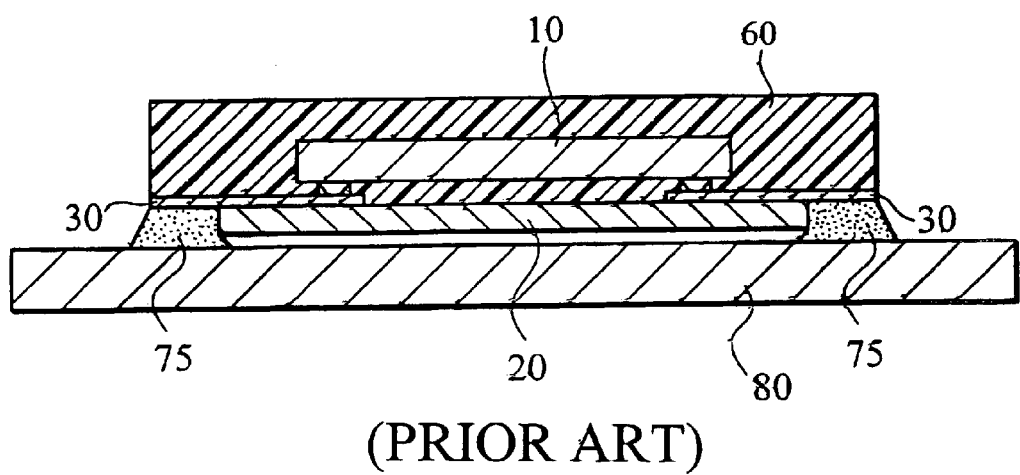
FIG. 3B is a sectional view showing the package of FIG. 3A mounted on a board.
Figure 4A:
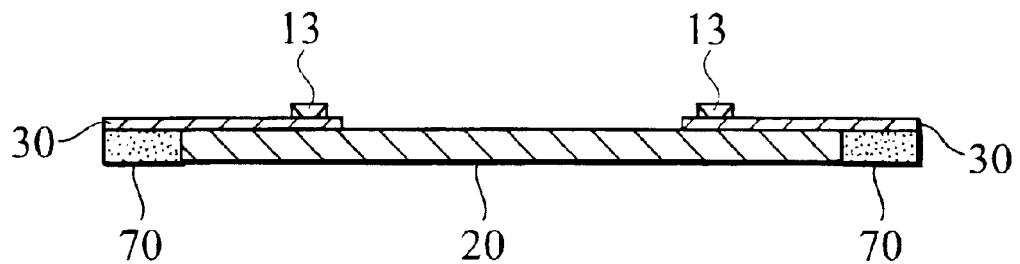
FIGS. 4A to 4C are sectional views showing a method of manufacturing the package of FIG. 3A.
Figure 4B:
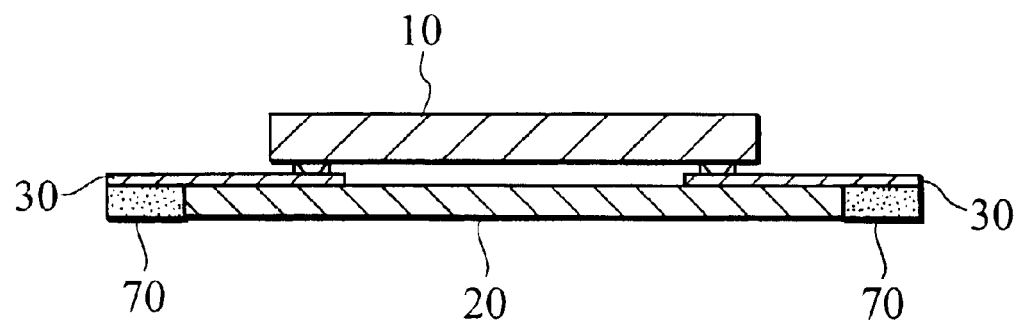
Figure 4C:
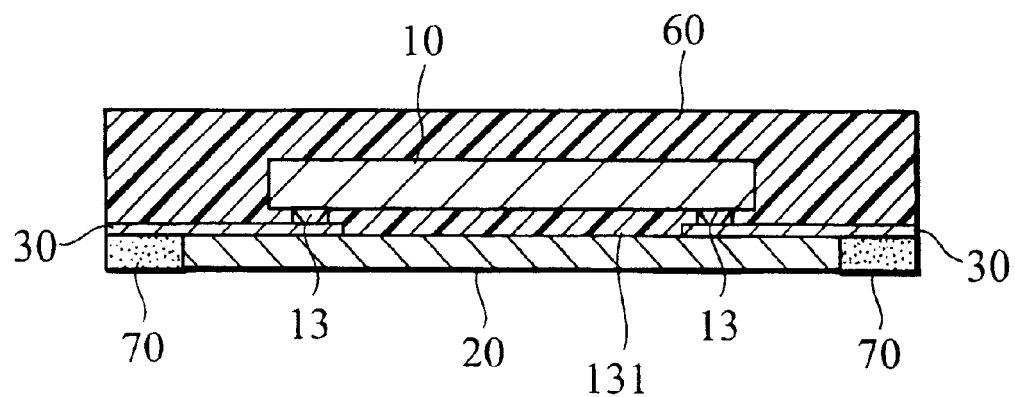

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 5A:
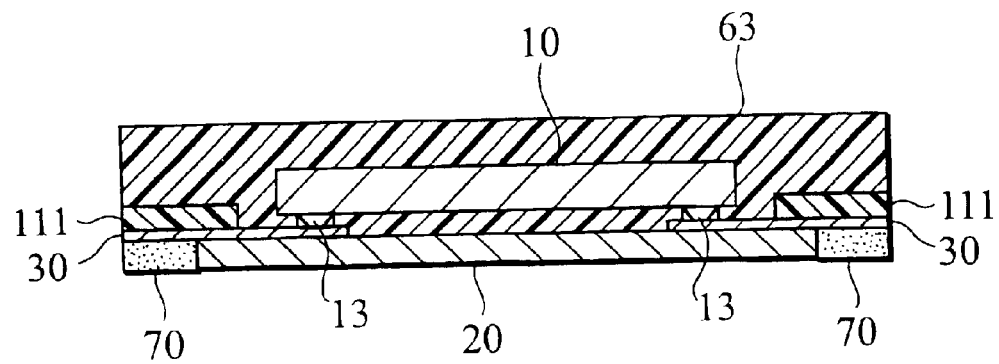
FIGS. 5A, 5B, and 5C are sectional, side, and perspective views, respectively, showing a semiconductor package according to a first embodiment of the present invention.
Figure 5B:
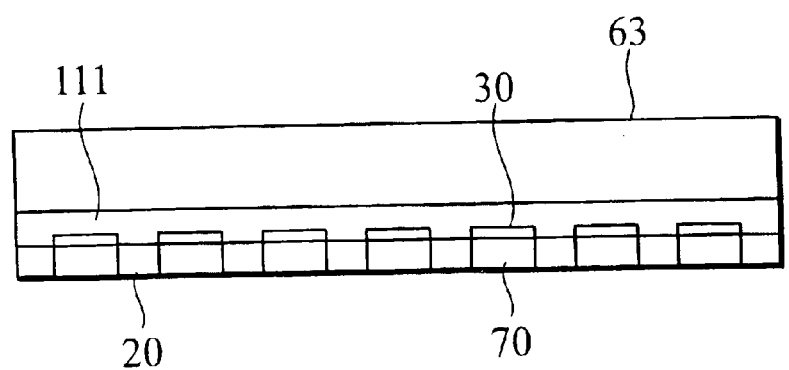
Figure 5C:
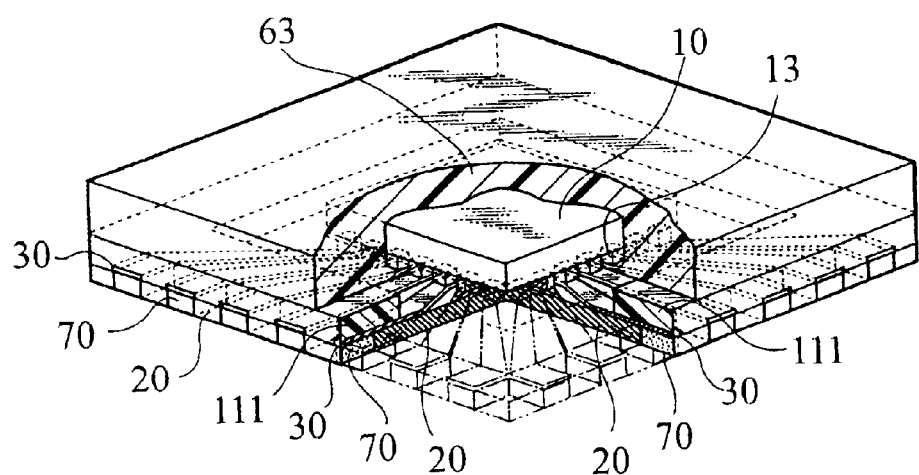

As shown in FIGS. 5A, 5B and 5C, the semiconductor package according to the first embodiment has (a) a package base 20, (b) package terminals 70 formed on the package base 20 and used to connect the package to another device, (c) a wiring layer 30 formed on the package base 20 and electrically connected to the package terminals 70, (d) a semiconductor chip 10 mounted on the package base 20 and electrically connected to the wiring layer 30, (e) a low-elasticity resin layer 111 formed between a resin mold 63 and the wiring layer 30 and between the package base 20 and the resin mold 63, and (f) the resin mold 63 sealing the package base 20, the wiring layer 30, the semiconductor chip 10, and the low-elasticity resin layer 111. The low-elasticity resin layer 111 has a lower elasticity modulus E than the resin mold 63.

The package base 20 is made of, for example, polyimide resins or glass epoxy resins. The wiring layer 30 is made of, for example, copper (Cu) or gold (Au). The semiconductor chip 10 is electrically connected to the wiring layer 30 by, for example, flip-chip (face-down) bonding or wire bonding. The low-elasticity resin layer 111 is made of, for example, epoxy-based thermoset resins or acryl-based thermoset resins. For example, the layer 111 is made of a resin having a thermal expansion coefficient $\alpha$ of 30 to 100 ppm/K and an elasticity modulus E of 1 to 6 GPa at 218K.

The resin mold 63 is made of, for example, epoxy-based thermoset resins or biphenyl-based thermoset resins. For example, the resin mold 63 is made of a resin having a thermal expansion coefficient $\alpha$ of 10 to 18 ppm/K and an elasticity modulus E of 10 to 20 GPa at 218K.

According to the first embodiment, the low-elasticity resin layer 111 is made of a resin having an elasticity modulus E of 1.9 GPa at 208K, and the resin mold 63 is made of a resin having an elasticity modulus E of 20 GPa at 208K and a thermal expansion coefficient $\alpha$ of 15 ppm/K.

Figure 6:
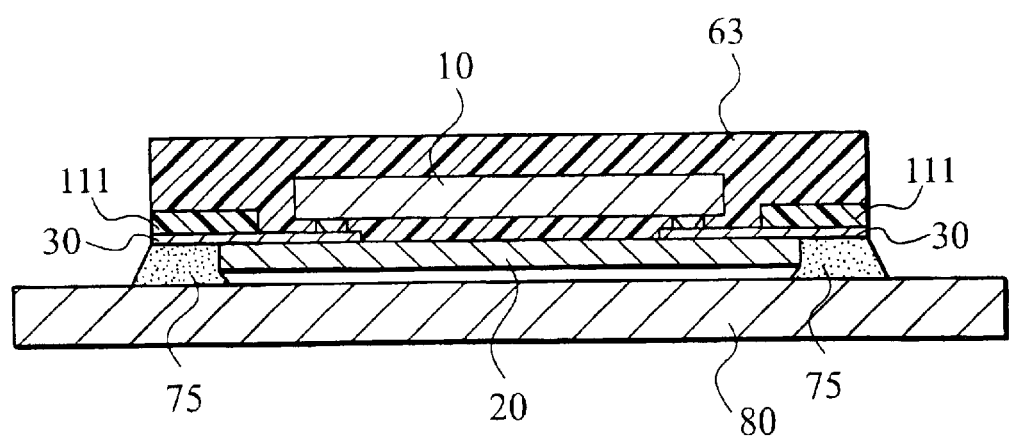
FIG. 6 is a sectional view showing the package of FIGS. 5A to 5C mounted on a board.

Referring to FIGS. 5A and 5C, the first embodiment forms the low-elasticity resin layer 111 along the edges of the package, i.e., around the semiconductor chip 10 that is positioned at the center of the package. Referring to FIGS. 5B and 5C, the layer 111 is formed not only on the wiring layer 30 but also on the package base 20. The resin mold 63 is formed over the layer 111. FIG. 6 is a sectional view showing the package of FIGS. 5A to 5C mounted on a board 80 with solder 75.

Figure 7A:
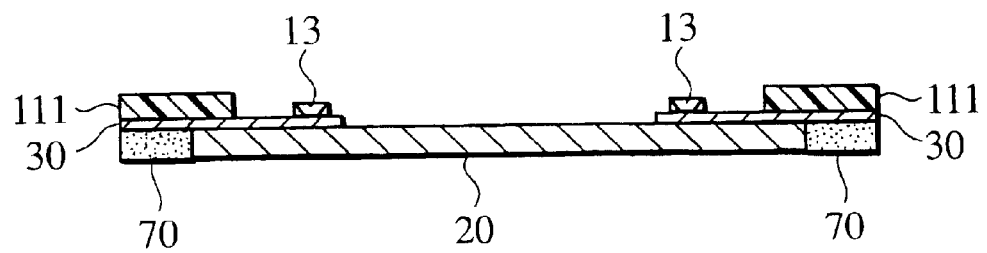
FIGS. 7A to 7C are sectional views showing a method of manufacturing the package of FIGS. 5A to 5C.
Figure 7B:
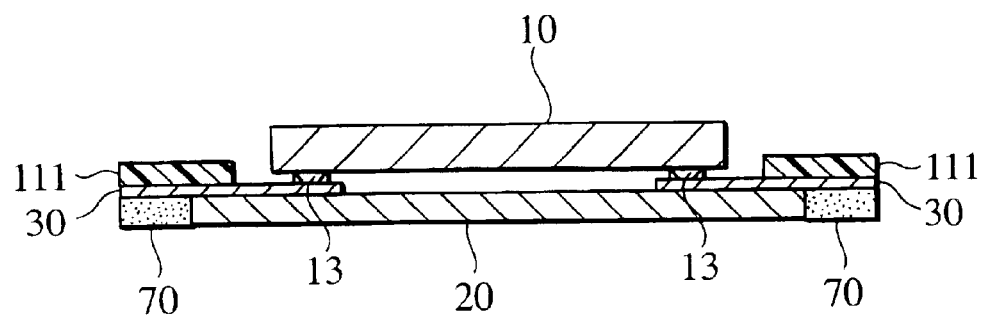
Figure 7C:
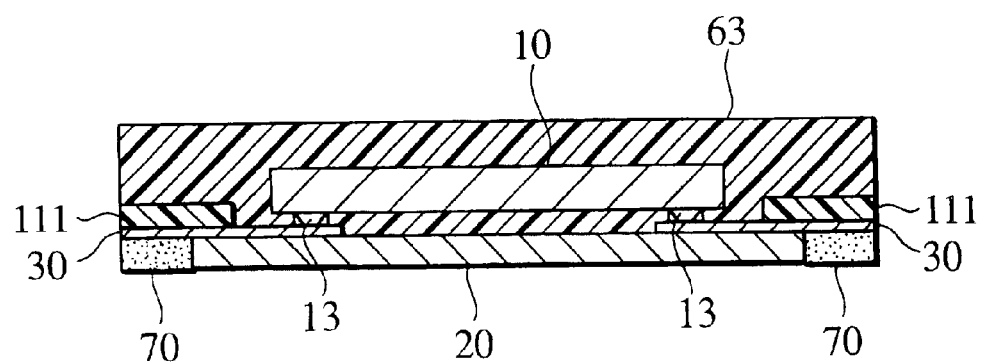

In FIG. 7A, a wiring layer 30 is formed on a package base 20 having package terminals 70. ILB parts 13 and a low-elasticity resin layer 111 are formed on the wiring layer 30. If the low-elasticity resin layer 111 is made from a paste-like material, a dispenser is employed. If the layer 111 is made from a film-like material, punching and bonding operations are employed. In FIG. 7B, a semiconductor chip 10 is placed, and electrode terminals of the chip 10 are connected to the wiring layer 30 through the ILB parts 13. In FIG. 7C, the chip 10, package base 20, wiring layer 30, ILB parts 13, and resin layer 111 are sealed with a resin mold 63.

The semiconductor package according to the first embodiment provides the following effectiveness:

(1) When the package is subjected to a temperature cycle test, the ILB parts 13 will show low reliability if the resin around the ILB parts 13 has a high thermal expansion coefficient $\alpha$. This is because the resin around the ILB parts experiences thermal contraction due to the high thermal expansion coefficient. To avoid this problem and improve the reliability of the ILB parts 13, the first embodiment seals the ILB parts 13 with the resin mold 63 having a low thermal expansion coefficient $\alpha$.

(2) The wiring layer 30 experiences strain due to stress from the package terminals 70. This may cause the peeling of the resin mold 63 from the wiring layer 30 if the elasticity modulus of the resin mold 63 is so high (hard) that the resin mold 63 bonds improperly to the package base 20. To avoid this problem and improve adhesion between the resin mold 63 and the wiring layer 30, the first embodiment forms the low-elasticity (soft) resin layer 111 between them.

(3) The resin mold 63 having a high elasticity modulus is hard and improperly bonds to the package base 20 to cause the peeling of the resin mold 63 from the package base 20 during a dicing operation if the resin mold 63 is directly bonded to the package base 20. The first embodiment forms the low-elasticity resin layer 111 serving as a bonding layer between the resin mold 63 and the package base 20, to firmly fix them together.

(4) The first embodiment seals the package with the resin mold 63 without an underfill resin layer, to save the cost of the underfill resin layer.

(5) The low-elasticity resin layer 111 is required to provide adhesion around the package terminals 70, i.e., at the periphery of the package. Accordingly, the layer 111 may be made from an inexpensive resin having a low elasticity modulus E and a high thermal expansion coefficient $\alpha$, to reduce the cost of the package.

(Second Embodiment)

The parts explained in the first embodiment are represented with like reference numerals to avoid repetitive explanations in the second embodiment. Characteristic parts of the second embodiment will be explained.

Figure 8A:
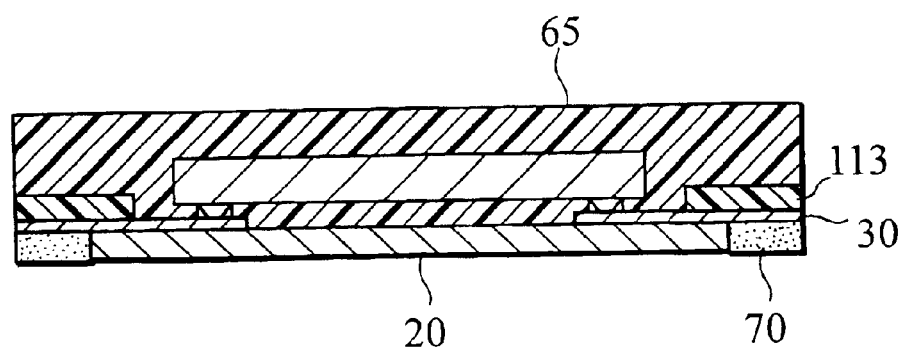
FIGS. 8A, 8B, and 8C are sectional, side, and perspective views, respectively, showing a semiconductor package according to a second embodiment of the present invention.
Figure 8B:
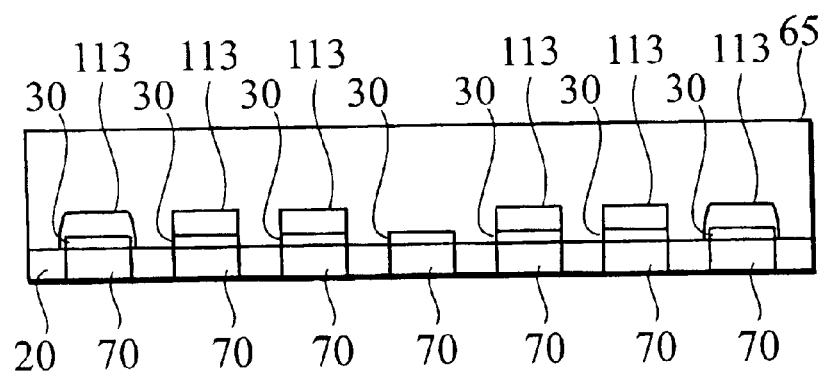
Figure 8C:
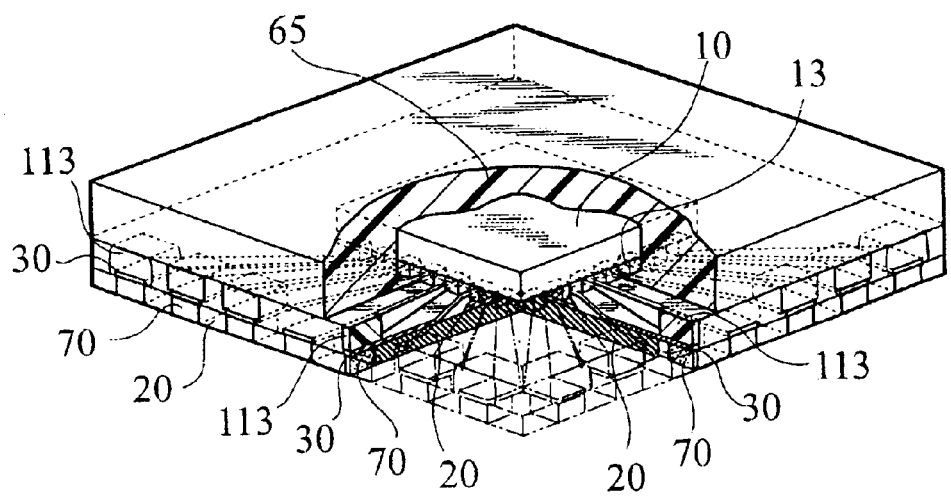

As shown in FIGS. 8A, 8B, and 8C, the semiconductor package according to the second embodiment has a low-elasticity resin layer 113 only between a wiring layer 30 and a resin mold 65.

In FIGS. 8B and 8C, the low-elasticity resin layer 113 is formed on the top face of the wiring layer 30, or on the top and side faces of the wiring layer 30. At the remaining locations, the resin mold 65 is in contact with a package base 20.

The low-elasticity resin layer 113 is not necessarily formed on every interface between the wiring layer 30 and the resin mold 65. The package may have a mixture of (a) interfaces between the wiring layer 30 and the resin mold 65 provided with the layer 113 and (b) interfaces between the wiring layer 30 and the resin mold 65 not provided with the layer 113.

The low-elasticity resin layer 113 is preferably formed between the wiring layer 30 and the resin mold 65 at least above each package terminal 70 where maximum strain is produced.

The second embodiment provides the same effectiveness as those provided by the first embodiment. The second embodiment forms the low-elasticity resin layer 113 only between the wiring layer 30 and the resin mold 65, thus reducing the quantity of resin required to make the layer 113 and thereby reducing the cost of the package. Due to the characteristics of a mold injection technique, the quantity of resin to make the resin mold 65 is unchanged in the first and second embodiments.

(Third Embodiment)

The parts explained in the first embodiment are represented with like reference numerals to avoid repetitive explanations in the third embodiment. Characteristic parts of the third embodiment will be explained.

Figure 9A:
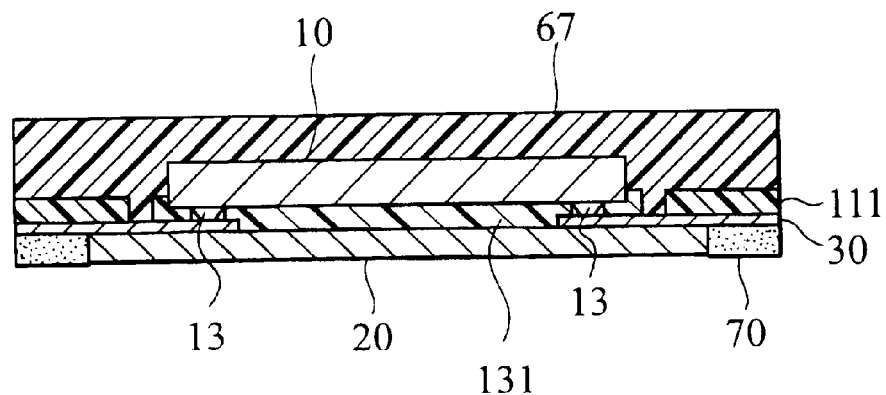
FIGS. 9A, 9B, and 9C are sectional, side, and perspective views, respectively, showing a semiconductor package according to a third embodiment of the present invention.
Figure 9B:
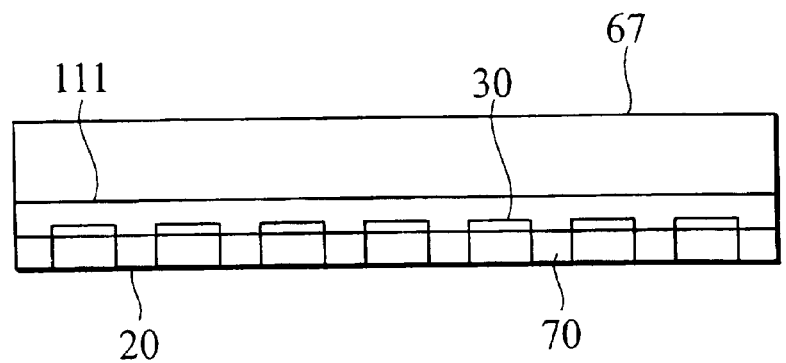
Figure 9C:
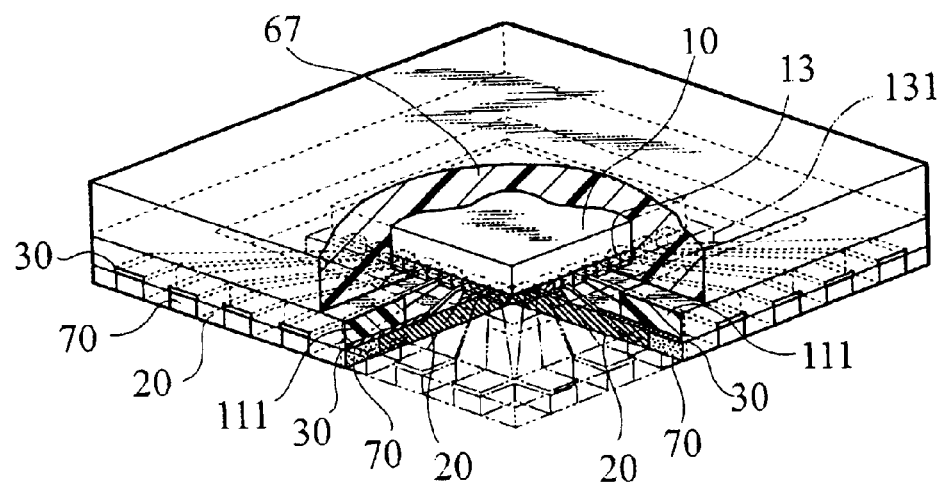

In FIGS. 9A and 9C, a wiring layer 30 and a semiconductor chip 10 are connected to each other through ILB parts 13, which are sealed with an underfill resin layer 131. The layer 131 may be an NCF and may preferably have a thermal expansion coefficient $\alpha$ of 30 to 80 ppm/K and an elasticity modulus E of 1 to 5 GPa at 218K.

According to the first or second embodiments, the ILB parts 13 between the wiring layer 30 and the semiconductor chip 10 are sealed with the resin mold (63, 65). On the other hand, the third embodiment seals the ILB parts 13 with the underfill resin layer 131.

In FIGS. 9B and 9C, a low-elasticity resin layer 111 is formed not only on the wiring layer 30 but also on a package base 20, as in the first embodiment. Namely, the layer 111 is in contact not only with the wiring layer 30 but also with the package base 20.

Figure 10A:
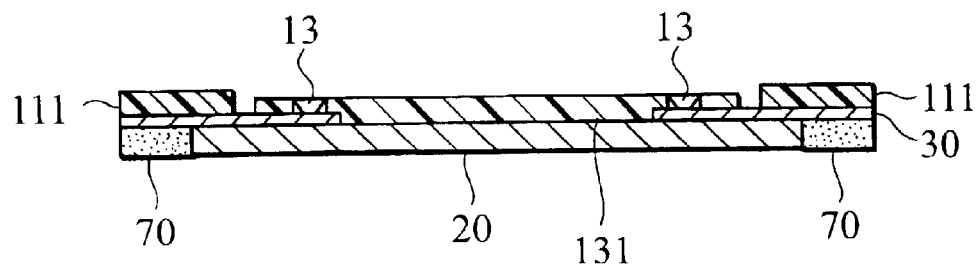
FIGS. 10A to 10C are sectional views showing a method of manufacturing the package of FIGS. 9A to 9C.
Figure 10B:
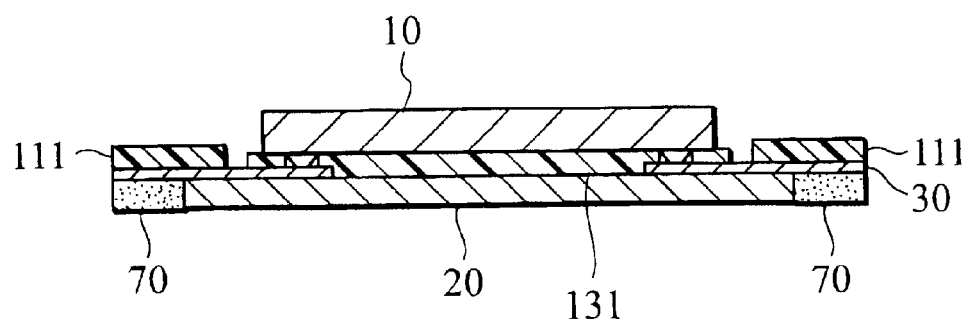
Figure 10C:
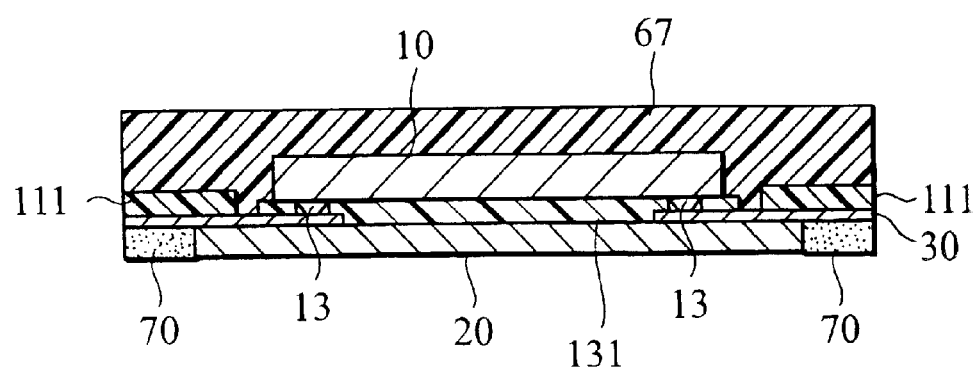

In FIG. 10A, a wiring layer 30 is formed on a package base 20 having package terminals 70. ILB parts 13 and a low-elasticity resin layer 111 are formed on the wiring layer 30. An underfill resin layer 131 is formed on the package base 20 and the wiring layer 30. If the layer 111 is made from a paste-like material, a dispenser is employed. If the layer 111 is made from a film-like material, punching and bonding operations are employed. The layer 131 is formed in the same manner as that forming the layer 111. In FIG. 10B, a semiconductor chip 10 is placed, and electrode terminals of the chip 10 are connected to the wiring layer 30 through the ILB parts 13. In FIG. 10C, the chip 10, wiring layer 30, resin layer 111, ILB parts 13, and resin layer 131 are sealed with a resin mold 67.

The semiconductor package according to the third embodiment provides the following effectiveness:

(1) The low-elasticity (soft) resin layer 111 formed above the package terminals 70 improves adhesion between the resin mold 67, the wiring layer 30, and the package terminals 70, i.e., at the OLB parts.

(2) The layer 111 above the package terminals 70 serves as a bonding layer to prevent the peeling of the resin mold 67 from the wiring layer 30, as is the first and second embodiments.

(3) Unlike the first and second embodiments where the ILB parts 13 are sealed with a resin mold, and therefore, involve a risk of damaging the ILB parts 13 while the package is being transported from an ILB connecting stage to a resin sealing stage, the third embodiment seals the ILB parts 13 with the underfill resin layer 131, reducing such a risk.

(Fourth Embodiment)

Figure 11A:
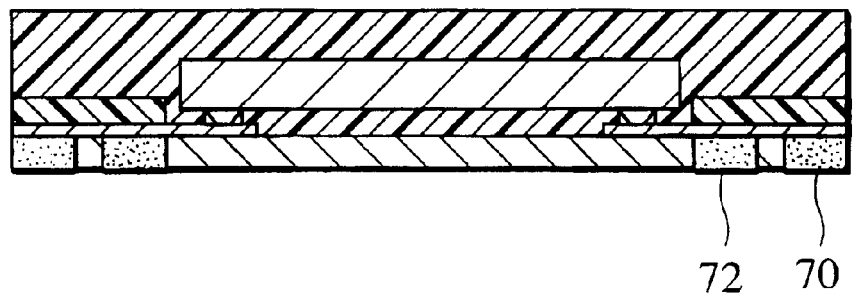
FIGS. 11A and 11B are sectional and bottom views, respectively, showing a semiconductor package according to a fourth embodiment of the present invention.
Figure 11B:
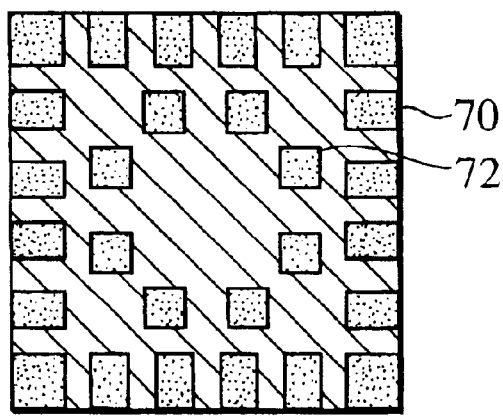
Figure 11C:
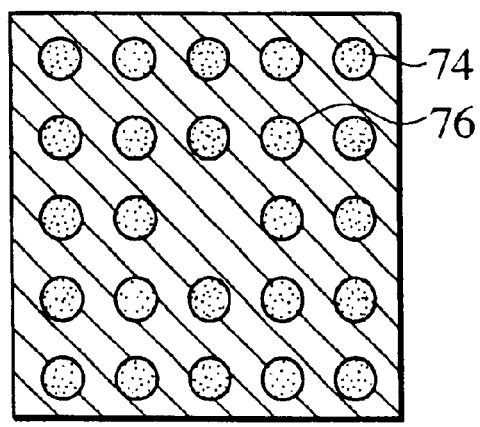
FIG. 11C is a bottom view showing differently shaped package terminals applicable to the package of FIG. 11A.

As shown in FIGS. 11A, 11B and 11C, the package according to the fourth embodiment employs area-type package terminals.

The parts explained in the first embodiment are represented with like reference numerals to avoid repetitive explanations in the fourth embodiment. Characteristic parts of the fourth embodiment will be explained.

In FIGS. 11A and 11B, the fourth embodiment forms package terminals not only at the periphery of a package base 20 but also within the package base 20. The package terminals 72 within the package base 20 are concentrically arranged.

In FIG. 11C, package terminals 74 are arranged slightly inside the periphery of a package base 20, and package terminals 76 are squarely arranged on the inner side of the package terminals 74. In this way, package terminals of a semiconductor package according to the present invention are not necessarily arranged at the periphery of the package.

The fourth embodiment provides the same effectiveness as those provided by the first embodiment.

(Fifth Embodiment)

Figure 12:
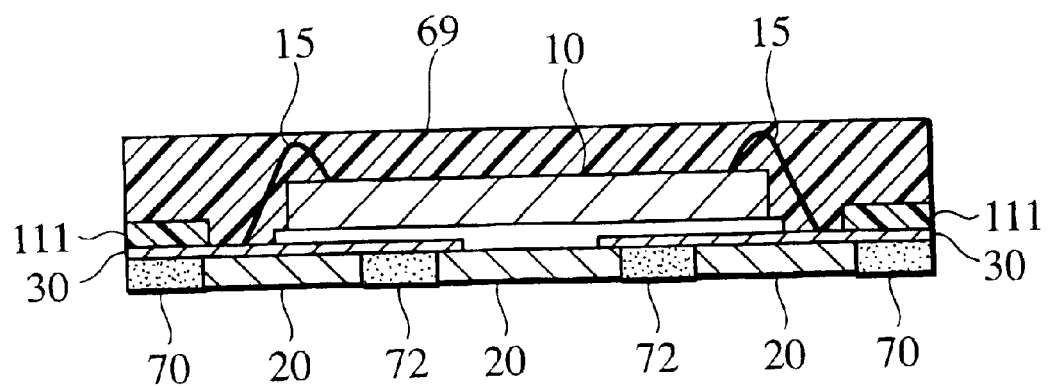
FIG. 12 is a sectional view showing a semiconductor package according to a fifth embodiment of the present invention.

As shown in FIG. 12, the fifth embodiment connects a semiconductor chip 10 to a wiring layer 30 through wires 15.

The fifth embodiment provides the same effectiveness as those provided by the first embodiment. The package of FIG. 12 employs area-type package terminals 70 and 72. This type of package terminal does not limit the present invention when the present invention is applied to wire-bonding semiconductor packages. Namely, the present invention is applicable to wire-bonding semiconductor packages with package terminals that are not of the area type.

As mentioned above, the semiconductor package according to any one of the embodiments of the present invention has a low-elasticity (soft) resin layer between a wiring layer and a resin mold in the package, to improve adhesion at OLB parts of the package.

Although the present invention has been described in terms of various embodiments, it is not intended that the invention be limited to these embodiments. Modification within the spirit of the invention will be apparent to those skilled in the art.

What is claimed is:

1. A semiconductor package adapted for connection to an external device, comprising:
   a package base;
   package terminals formed in the package base and adapted for connection to the external device;
   a wiring layer formed on the package base and electrically connected to the package terminals;
   a semiconductor chip mounted on the package base and electrically connected to the wiring layer;
   a low-elasticity resin layer formed between a resin mold and the wiring layer and between the package base and the resin mold, and extending from a rim inward to a predetermined extent being back from the outer edge of the semiconductor chip, and an end face of the low-elasticity resin layer being exposed at the outer edge of the semiconductor package; and
   the resin mold sealing the package base, the wiring layer, the semiconductor chip, and the low-elasticity resin layer; and
   the low-elasticity resin layer having a lower elasticity modulus than the resin mold.

2. The semiconductor package of claim 1, wherein the low-elasticity resin layer is disposed between the wiring layer and the resin mold above the package terminals.

3. The semiconductor package of claim 1, wherein the low-elasticity resin layer is disposed between the wiring layer and the resin mold above package terminals where maximum strain is experienced.

4. The semiconductor package of claim 1, wherein electric contacts between the wiring layer and the semiconductor chip are sealed with an underfill resin layer.

5. The semiconductor package of claim 1, where the low-elasticity resin layer is made of epoxy-based thermoset resins or acryl-based thermoset resins.

6. The semiconductor package of claim 1, where the low-elasticity resin layer is made of a resin having a thermal expansion coefficient of 30 to 100 ppm/K and an elasticity modulus E of 1 to 6 GPa at 218K.

7. A semiconductor package adapted for connection to an external device, comprising:
   a package base;
   a package terminal formed in the package base and adapted for connection to the external device;
   a wiring layer formed on the package base and electrically connected to the package terminal;
   a semiconductor chip mounted on the package base and electrically connected to the wiring layer;
   a low-elasticity resin layer formed between a resin mold and the wiring layer, and extending from a rim inward to a predetermined extent being back from the outer edge of the semiconductor chip, and an end face of the low-elasticity resin layer being exposed at the outer edge of the semiconductor package; and
   the resin mold sealing the package base, the wiring layer, the semiconductor chip, and the low-elasticity resin layer,
   the low-elasticity resin layer having a lower elasticity modulus than the resin mold.

* * * * *